US00RE41799E

(19) United States
(12) Reissued Patent
Russo et al.

(10) Patent Number: US RE41,799 E
(45) Date of Reissued Patent: Oct. 5, 2010

(54) COATING COMPOSITION FOR GLASS

(75) Inventors: David A. Russo, Norristown, PA (US); Ryan R. Dirkx, Glenmoore, PA (US); Glenn P. Florczak, East Brunswick, NJ (US)

(73) Assignee: Arkema Inc., Philadelphia, PA (US)

(21) Appl. No.: 09/287,664
(22) Filed: Apr. 7, 1999

Related U.S. Patent Documents

Reissue of:
(64) Patent No.: 5,401,305
Issued: Mar. 28, 1995
Appl. No.: 08/104,125
Filed: Dec. 13, 1993

U.S. Applications:
(60) Division of application No. 08/544,212, filed on Oct. 17, 1995, now abandoned, which is a continuation-in-part of application No. 07/814,352, filed on Dec. 27, 1991, now abandoned, which is a continuation-in-part of application No. 07/814,366, filed on Dec. 26, 1991, now abandoned.

(51) Int. Cl.
*C23C 16/18* (2006.01)

(52) U.S. Cl. ..... 427/255.35; 427/109; 427/126.1; 427/126.2; 427/126.3; 427/255.18; 427/255.17; 427/255.35

(58) Field of Classification Search ..... 428/212, 428/426, 428, 432, 681, 692, 699, 701, 702, 428/704, 429, 447, 448, 450; 106/287.1, 106/287.12–287.16, 287.18, 287.19; 65/60.1, 65/60.2, 60.5, 60.51–60.53, 60.8; 427/108, 427/126.1, 126.2, 126.3, 165–167, 255, 255.2, 427/255.3, 255.7, 419.1, 419.3, 109, 255.18, 427/255.17, 255.35
See application file for complete search history.

(56) References Cited

U.S. PATENT DOCUMENTS

| | | | | | |
|---|---|---|---|---|---|
| 4,227,929 | A | * | 10/1980 | Law et al. | 106/1.17 |
| 4,308,316 | A | * | 12/1981 | Gordon | 428/336 |
| 4,880,664 | A | * | 11/1989 | O'dowd et al. | 427/109 |
| 5,028,566 | A | * | 7/1991 | Lagendijk | 437/238 |
| 5,401,305 | A | * | 3/1995 | Russo et al. | 106/287.1 |

FOREIGN PATENT DOCUMENTS

| | | | |
|---|---|---|---|
| JP | 57-34164 | * | 2/1982 |
| JP | 58-189263 | * | 4/1983 |
| RU | 833649 | * | 6/1981 |

* cited by examiner

*Primary Examiner*—David M. Brunsman
(74) *Attorney, Agent, or Firm*—Steven D. Boyd

(57) ABSTRACT

A composition for coating glass by chemical-vapor deposition comprises a mixture of a tin oxide precursor monobutyltin trichloride, a silicon dioxide precursor tetraethylorthosilicate, and an accelerant such as triethyl phosphite; the composition is gaseous below 200° C., and permits coating glass having a temperature from 450° to 650° C. at deposition rates higher than 350 Å/sec. The layer of material deposited can be combined with other layers to produce an article with specific properties such as controlled emissivity, refractive index, abrasion resistance, or appearance.

27 Claims, No Drawings

COATING COMPOSITION FOR GLASS

Matter enclosed in heavy brackets [ ] appears in the original patent but forms no part of this reissue specification; matter printed in italics indicates the additions made by reissue.

CROSS-REFERENCE TO RELATED APPLICATION

*This is a division of application Ser. No. 08/544,212, filed Oct. 17, 1995 which is a RE of 08/104,125, Dec. 13, 1993, U.S. Pat. No. 5,401,305, all of which are incorporated herein by reference.*

This application is a continuation-in-part of our U.S. patent applications, Ser. Nos. 07/814,366, now abandoned, filed Dec. 26, 1991, and 07/814,352, now abandoned, filed Dec. 27, 1991, and a PCT national stage filing under 35 U.S.C. 371 of PCT/US92/10873.

BACKGROUND OF THE INVENTION

1. Field of the Invention

The present invention is in the field of coatings on substrates. More particularly, this invention is in the field of compositions for the deposition of coatings at high rates on glass or glass articles to provide controlled refractive index, improved emissivity characteristics, and/or appearance and abrasion resistance, and to complement or enhance other properties.

2. Description of the Prior Art

Transparent semi-conductor films such as indium oxide, cadmium stannate, or doped tin oxide, can be applied to various transparent substrates such as, e.g., soda-lime glasses, in order to reflect long-wavelength infrared radiation. Transparent dielectric films such as titanium dioxide or undoped tin oxide can be applied to transparent articles such as glass bottles to form a base coat for a second coating with a specific function. Depending on the thickness of the semiconductor or dielectric film, various reflected iridescent colors may be observed. This iridescent effect is considered to be detrimental to the appearance of the glass in applications such as windows with low emissivity, or bottles for food or beverages.

Methods and apparatus for coating glass, and especially continuous coating on moving glass, are known in the art. A description of apparatus useful in preparing a coated-glass, article is found in Lindner, U.S. Pat. No. 4,928,627, made a part of this disclosure by reference herein.

Various procedures have been devised for reducing or eliminating iridescence. For the low-emissivity application, Zaromb, in U.S. Pat. No. 3,378,396, describes an article comprising a transparent glass substrate coated with tin and silicon oxides; the coating varies gradually in composition from a high ratio of silicon oxide to tin oxide: at the substrate surface, gradually changing to almost pure tin oxide, and changing further to a ratio of not more than 60% silicon oxide to not less than 40% tin oxide at the interface of that coating with the atmosphere. The refractive index of the coating nearest to the substrate is about 1.5, substantially the refractive index of silica glass, and changes to about 2.0, the refractive index of tin oxide, at the air interface, providing an intermediate coating layer without an optical interface. The article so coated has little to no iridescence in reflected light. Zaromb teaches that aqueous solutions of tin and silicon chlorides can be spray-applied to achieve his coatings. Spray applications are usually batch operations which do not yield high-quality, uniform films; there is no mention of other means of application such as chemical-vapor deposition (CVD). He also fails to give an indication of the deposition rate, a key parameter for a commercial industrial application.

Another approach is described by Gordon in U.S. Pat. No. 4,187,336. One or more layers of a transparent material with a refractive index intermediate between that of a glass substrate and a conductive tin oxide film are deposited by atmospheric-pressure CVD between the glass and the tin oxide film. It is necessary for the intermediate layers to have specific refractive indices and thicknesses in order to be effective. It is noted that when the intermediate films contained silicon dioxide, suitable volatile compounds were found to be silane, dimethysilane, diethylsilane, tetramethyl silane, and the silicon halides. No other precursors are mentioned. The deposition rates obtained for the processes described were on the order of from 10 to 20 Angstroms per second (Å/sec.). Such rates are an order of magnitude below those necessary for a commercial industrial process.

In U.S. Pat. No. 4,206,252, Gordon describes a process for depositing mixed oxide and nitride coating layers of continuously varying refractive index between a glass substrate and an infra-red-reflecting coating, whereby the film iridescence is eliminated. When silicon dioxide is part of the mixed oxide film, the patent teaches that volatile silicon compounds with Si—Si and Si—H bonds are suitable precursors. Compounds such as 1,1,2,2-tetramethyldisilane, 1,1,2-trimethyldisilane, and 1,2-dimethyldisilane are disclosed. All of the compounds containing Si-Si and Si-H bonds to which reference is made are expensive, and none are comercially available.

In U.S. Pat. No. 4,386,117, Gordon describes a process for preparing mixed silicon oxide/tin oxide coatings all specific refractive indices or a continuous gradient as taught by Zaromb in U.S. Pat. No. 3,378,396, at optimum deposition rates of 80 to 125 Å/sec, using alkoxy-peralkylpolysilane precursors such as methoxypentamethyldisilane or dimethyoxytetramethyldisilane. Again, the silica precursors cited and inferred are impractical for industrial use, because none of them is commercially available on a large scale.

Legendijk, in U.S. Pat. No. 5,028,566, notes in column 4 that tetraethyl orthosilicate (TEOS) suffers from a number of disadvantages in its application to a substrate by low-pressure CVD; that is, a pressure of about 500 milliTorr. These disadvantages include difficulty of doping the resultant film with phosphorus, and controlled-source delivery due to the low vapor pressure of TEOS. Lagendijk also points out that attempts at an all-liquid process to produce borophosphosilicate glass have met with limited success. The further equates the dopant effect within a board range of phosphorus, boron, antimony, arsenic and chromium compounds, but only when used with silicon compounds having no carbon-oxygen-silicon bonds, and two or more silicon atoms.

In bottle applications, the coatings are applied at such low thicknesses, i.e., about 100 Å, that no iridescence is possible. However, the films are not continuous, and this discontinuity makes them unsuitable for other applications. One solution to the, discontinuity is to deposit thicker films of a material with a refractive index closer to that of the article. A mixed metal oxide/silicon oxide material deposited at a significantly more rapid rate than has heretofore been achieved would be desirable, as discussed further hereinbelow.

All the silanes disclosed in the prior art for making mixed metal oxide/silicon dioxide coatings have certain features which make them unsatisfactory for commercial development. Some are very corrosive, flammable, or oxygen-sensitive, and require special handling. Others are not readily available, or are too expensive for commercial use. Of the materials which can be used, the biggest problem which limits their commercial development in mixed metal oxide/silicon oxide and/or axynitride intermediate layers has been that of inadequate deposition rates. When the substrate is flat glass and the deposition process is CVD at ambient pressure, the deposition rate of the intermediate layers must be high enough to coat a production-line glass ribbon traveling at line speeds as high as about 15 meters per minute (m/min). Rates for deposition of the desired layers of about 350 Å are desirable, and rates on the order of 400 and 600 Å/sec are preferable. Such rates have not heretofore been achieved under conditions which permit continuous, mass production of glass with properties.

To overcome the problems as discussed hereinabove, silica precursors are needed which are inexpensive, readily available, easy to handle, and have adequate deposition rates when vaporized with metal oxide precursors. Alkoxysilanes such as TEOS, a commodity chemical, would be desirable. However, prior to the present invention, it has not been possible to deposit silicon oxide films from TEOS by atmospheric-pressure CVD at commercially acceptable deposition rates, except at temperatures at or above 700 degrees Celsius (°C.). Some success has been achieved at temperatures of from about 450° to about 688° C., but only by modifying the atmospheric-pressure CVD process through plasma enhancement or reduced pressure, neither of which is generally acceptable for commercial use on a continuous glass ribbon. Additives such as oxygen, ozone, or trimethyl phosphite have also been used in these modified processes, but the rates achieved are still lower than those needed for an effective commercial system.

D. S. Williams and E. A. Dein, in J. Electrochem. Soc. 134(3) 657-64 (1987), showed that phosphosilicate and borophosphosilicate glass films with controllable refractive index can be deposited at rates of about 200 Å/sec between 515° and 680° C. by the low-pressure CVD of TEOS with phosphorous or boron oxides in concentrations which varies as a function of the additive used. The low-pressure process described here is not amenable to a continuous on-line application of oxides.

In Proceedings, $2^{nd}$ International ULSI Science and Technical Symposium, ECS Proceedings Vol. 98(9), 571-78 (1989), D. A. Webb et al. reported that silicon oxide films could be deposited from TEOS at rates of about 125 Å/sec in a plasma-enhanced CVD process using oxygen. However, plasma-enhanced CVD is not a viable option for the continuous commercial application of oxide films to glass, being a batch process requirement complex and costly low-pressure apparatus.

A. K. Hochberg and D. L. O'Meara in J. Electrochem. Soc. 136(6) 1843 (1989) reported enhanced deposition of silicon oxide films at 570° C. by CVD at low pressure when trimethylphosphite was added to TEOS. As with plasma-enhanced CVD, however, low-pressure CVD is not readily utilized for the continuous commercial application of silicon-oxide films on a moving glass sheet to produce a coated-glass article, due at least in part to the cost and complexity of the device used for deposition at low pressure.

From a review of a prior art, it cannot be determined what precursor combinations, if any, can be used for continuous deposition, under conditions and at a rate suitable for mass production, of mixed metal oxide/silicon oxide films at adequate rates from readily available and relatively inexpensive reagents.

Primary or secondary coatings on glass substrates are further useful to enhance or complement properties of either the substrate or one or more of the coatings thereon, improvement of iridesence being only one application. Other uses of coatings include, e.g., protection of the substrate surface from abrasion, addition of color to clear glass, and screening of particular wavelengths of incident radiation.

DISCUSSION OF THE INVENTION

This invention is a gaseous composition for producing an improved coating on glass, wherein the coated glass exhibits specific properties such as, e.g., controlled refractive index, abrasion resistance, color enhancement, low emissivity, selective light filtration, and anti-iridescence on flat-glass substrates. The invention is made by CVD at rates greater than about 350 Å/sec. at atmospheric pressure and at temperatures lower than 700° C., by using a mixture which includes at least one precursor for a metal oxide, selected from the group consisting of volatile compounds of tin, germanium, titanium, aluminum, zirconium, zinc, indium, cadmium, hafnium, tungsten, vanadium, chromium, molybdenum, iridium, nickel and tantalum. The gaseous composition further includes a precursor for silicon dioxide, and one or more additives selected from the group consisting of phosphites, borates, water, alkyl phosphine, arsine and borane derivatives; $PH_3$, $AsH_3$ and $B_2H_6$; and $O_2$, $N_2O$, $NF_3$, $NO_2$ and $CO_2$. The additives are termed "accelerants" herein; the accelerants serve to increase the rate of deposition of the film onto the glass from the mixture. The mixture of precursors and additives is gaseous under the conditions of application required to produce the coated-glass article; the reaction of the materials in the gaseous mixture with atmospheric or added oxygen provides the corresponding oxides which are deposited on the glass substrate.

Those skilled in the art will understand that precursors and materials discussed in this specification must be sufficiently volatile, alone or with other materials, and sufficiently stable under the conditions of deposition, to be a part of the composition from which the desired films are deposited.

Precursors for deposition of metal oxides include, e.g., aluminum alkyls and alkoxides, cadmium alkyls, germanium halides and alkoxides, indium alkyls, titanium halides, zinc alkyls, and zirconium alkoxides. Specific examples of such compounds include, e.g., $Al(C_2H_5)_3$, $CrO_2Cl_2$, $GeBr_4$, $Ti(OC_3H_7)_4$, $TiCl_4$, $TiBr_4$, $Ti(C_5H_7O_2)_4$, $Zr(OC_5H_9)_4$, $Ni(CO)_4$, $VCl_4$, $Zn(CH_3)_2$, $Zr(C_5H_9O)_4$, and the like.

Tin precursors include those described by the general formula $R_nSnX_{4-n}$, where R is independently chosen from straight, cyclic, or branched-chain alkyl or alkenyl of from one to about six carbons; phenyl, substituted phenyl, or $R'CH_2CH_2$—, where R' is $MeO_2C$—, $EtO_2C$—, $CH_3CO$—, or $HO_2C$—; X is selected from the group consisting of halogen, acetate, perfluoroacetate, and their mixtures; and where n is 0, 1, or 2. Preferred precursors for tin oxide in the article of this invention are the organotin halides.

Precursors for silicon oxide include those described by the general formula $R_mO_nSi_p$, where m is from 3 to 8, n is from 1 to 4, p is from 1to 4, and R is independently chosen from hydrogen and acyl, straight, cyclic, or branched-chain alkyl and substituted alkyl or alkenyl of from one to about six carbons, and phenyl or substituted phenyl. Preferred precursors for silicon oxide include tetraethylorthosilicate, diacetoxydi-t-butoxysilane, ethyltriacetoxysilane, methyltriacetoxysilane, methyldiacetoxylsilane, tetramethyldisiloxane, tetramethylcyclotetrasiloxane, dipinacoloxysilane, 1,1-dimethylsila-2-oxacyclohexane, tetrakis (1-methoxy-2-propoxy) silane, and triethoxysilane.

Suitable accelerants include phosphite and borate derivatives of the general formula $(R''O)_3P$ and $(R''O)_3B$, where R" is independently chosen from straight, cyclic, or branched-chain alkyl or alkenyl of from one to about six carbons; phenyl, substituted phenyl, or $R'''CH_2CH_2$—, where R''' is $MeO_2C$—, $EtO_2C$—, $CH_3CO$—, or $HO_2C$—; R" is preferably alkyl or alkenyl of from 1 to 4 carbons in length. Particularly preferred accelerants are those selected from the group consisting of boron and phosphorus esters; most preferred are TEB and TEP.

The precursors to the overcoated layer comprise MBTC or any of the organotins described by the general formula $R_nSnX_{4-n}$ above, and a material chosen to impart a semi-conductive property to the tin oxide; such materials include, e.g., antimony compounds such as trimethylantimony, phosphorous compounds such as triethylphophine, and fluorine-containing compounds such as trifluoroacetic acid, trifluoroacetic anhydride, ethyl trifluoroacetate, 2,2,2-trifluoroethanol, ethyl 4,4,4-trifluoroacetoacetone, heptafluorobutyryl chloride, and hydrogen fluoride. The tin oxide layer can also be made conductive by depositing substoiehiometric films having the composition $SnO_{2-x}$, wherein x is a non-integer having a value between zero and 1, and wherein the value of x can vary within a given film. The materials for imparting semi-conductive properties to the tin oxide can also be added to the precursors for the first layer, to enhance the emissivity of the entire coating system, i.e., the emissivity of the combined first and second layers.

Those skilled in the art will realize that the tin oxide can be replaced in these films entirely or in part by the oxides of other metals such as, e.g., germanium, titanium, aluminum, zirconium, zinc, indium, cadmium, hafnium, tungsten, vanadium, chromium, molybdenum, iridium, nickel and tantalum.

DESCRIPTION OF THE PREFERRED EMBODIMENTS

The preferred embodiment of the present invention is a gaseous composition at a temperature below about 200° C. at atmospheric pressure, adapted to deposit a film of tin ,oxide and silicon oxide at a rate greater than about 350 Å/sec. which comprises a precursor of tin oxide, a precursor of silicon oxide, an accelerant selected from the group consisting of organic phosphites, organic borates and water, and mixtures thereof, and a source of oxygen.

In another embodiment of this invention, the composition results in a film deposited at atmospheric pressure wherein the film comprises one or more mixed metal oxide/silicon dioxide films on a glass substrate, the deposition being made from a mixture comprising a metal oxide precursor, a silicon dioxide precursor, and at least one additive which improves or accelerates the deposition rate significantly when compared to the deposition rate without the additive. The deposited films can contain additional oxides related to the additives used. Further, the deposited mixed oxide films can have specific properties in their own right such as, e.g., designed refractive index, or can be combined with other films, under- or overcoated, or both, to have a combined property such as, e.g., color neutrality or lubricity.

In a more-preferred embodiment, the composition provides a mixed metal oxide/silicon dioxide film comprising multiple tin oxide/silicon dioxide layers of, e.g., increasing refractive index; further, a chosen property of a given layer, such as, e.g., the refractive index, can vary continuously such that an overcoated layer of tin oxide will have minimal reflected color. A given layer may thus have a concentration of silicon oxide and tin oxide different from the concentrations of silicon oxide and tin oxide in an adjacent layer. The films can also contain oxides of the accelerants, particularly when the additives containing phosphorus or boron.

In a most-preferred embodiment of the composition of this invention, the precursors to the mixed oxide layer comprise organotin halides generally and monobutyltin trichloride (MBTC) in particular, TEOS, and the accelerant triethyl phosphite (TEP).

The compositions of the films produced by this invention were determined by X-ray diffraction (XRD) and X-ray photoelectron spectroscopy (XPS). The article of the present invention is prepared by a process using accelerants whereby the process provides a commercially acceptable continuous CVD deposition of oxide films on moving glass, especially on a modern float-glass line, where the batch processes of the prior art are entirely inapplicable.

The effects of added water and added phosphites and borates on the refractive index and deposition rate of TEOS-based mixed oxide films are shown in the following Tables. These results are contrasted to those in Tables IV and V, which show the effect of the additives oxygen and a Lewis acid.

Table I shows the effect of added water. As the water concentration is increased, regardless of the tin/silicon ratio or the gas velocity, the deposition rate increases to commercially significant levels. These rate increases are also accompanied by increases in refractive index. In the tables here, the reported deposition rates are approximate with a range of about seven percent, unless the rate is followed by an expressed ± uncertainty.

TABLE I

Effect of Water Concentration on Mixed Oxide Refractive Index and Deposition Rate

| MBTC mol % | TEOS mol % | Water mol % | R.I. | Dep. Rate Å/sec |
|---|---|---|---|---|
| 665° C. glass temperature, 160° C. system temperature, 50 l/min gas flow. | | | | |
| 0.71 | 0.71 | 0.00 | 1.54 | 25 |
| 0.71 | 0.71 | 0.15 | 1.73 | 340 |
| 0.71 | 0.71 | 0.24 | 1.74 | 400 |
| 665° C. glass temperature, 160° C. system temperature, 12.5 l/min gas flow. | | | | |
| 1.05 | 0.59 | 0.00 | 1.74 | 290 |
| 1.05 | 0.59 | 0.60 | 1.78 | 330 |
| 1.05 | 0.59 | 1.10 | 1.80 | 480 |

While 160° C. is preferred, the system temperature can be from about 125° to about 200° C.

Table II shows the effects of added TEP and of mixtures of TEP and lower-alkyl borate esters such as triethyl borate (TEB). The results show that TEP is very effective in accelerating the deposition rates of the mixed-oxide films to a high rate at specific and controlled refractive-index values. Additions of TEB at low levels to the TEP resulted in an additional small increase in rate. As used in this; specification, the term "high rate," as applied to the film deposition described herein, is greater than about 350 Å/sec, and preferably about 400 Å/sec or higher. All the films produced under the conditions of Table II were clear.

TABLE II

Effect of MBTC/TEOS/TEP Concentrations on Deposition Rate

| % TEOS | % MBTC | % TEP | % TEB | R.I. | Dep. Rate Å/sec |
|---|---|---|---|---|---|
| 0.80 | 0.16 | — | — | 1.69 ± .02 | 38 ± 3 |
| 0.80 | 0.11 | 0.76 | — | 1.58 ± .01 | 542 ± 8 |
| 0.80 | 0.16 | 0.76 | — | 1.60 ± .01 | 416 ± 22 |
| 0.78 | 1.56 | 0.75 | — | 1.67 ± .01 | 505 ± 4 |
| 0.78 | 1.84 | 0.75 | — | 1.69 ± .01 | 476 ± 45 |
| 0.28 | 1.56 | 0.36 | — | 1.73 ± .01 | 231 ± 46 |
| 0.27 | 1.56 | 0.62 | — | 1.71 ± .01 | 381 ± 15 |
| 0.27 | 1.56 | 0.75 | — | 1.70 ± .01 | 482 ± 6 |
| 0.27 | 1.56 | 0.75 | — | 1.70 ± .01 | 482 ± 16 |
| 0.27 | 1.56 | 0.74 | 0.18 | 1.70 ± .02 | 492 ± 13 |
| 0.79 | 0.16 | 0.76 | 0.19 | 1.59 ± .01 | 473 ± 56 |

The glass temperature was 665° C., its speed, 0.56 m/sec; system temperature 160° C., air. MBTC, TEOS, and TEP or the mixture of TEP and TEB were injected separately into the vaporizer section of the coater. Each data point was the average of three samples. The dew point was from −74° to −78° C.

Table III shows the effect of added oxygen. Increasing the oxygen concentration increases the deposition rate significantly, but not to the levels needed for commercial application.

TABLE III

Effect of Oxygen Concentration On Mixed Oxide Refractive Index and Deposition Rate

| MBTC mol % | TEOS mol % | Oxygen vol % of air | R.I. | Dep. Rate Å/sec |
|---|---|---|---|---|
| 0.71 | 0.71 | 20 | 1.54 | 25 |
| 0.71 | 0.71 | 50 | 1.63 | 50 |
| 0.71 | 0.71 | 75 | 1.65 | 160 |
| 0.71 | 0.71 | 100 | 1.66 | 240 |

665° C. glass temperature, 160° C. system temperature, 50 l/min gas flow.

Table IV shows the effect of added Lewis acid, which in this case is excess MBTC. As the concentration increases, the rate increases, although not to the levels needed for commercial application.

TABLE IV

Effect of MBTC Concentration on Mixed Oxide Refractive Index and Deposition Rate

| MBTC mol % | TEOS mol % | R.I. | Dep. Rate Å/sec |
|---|---|---|---|
| 0.48 | 0.47 | 1.78 | 160 |
| 0.48 + 0.23 | 0.48 | 1.78 | 200 |
| 0.48 + 0.47 | 0.47 | 1.85 | 300 |

665° C. glass temperature, 160° C. system temperature, 50 l/min gas flow.

The data in the tables show that effective CVD of mixed oxide films can be achieved at commercial rates by the present invention, with concomitant control of refractive index. The following examples illustrate preferred embodiments of this invention.

EXAMPLE 1

A square plate of soda-lime silica glass, 9 centimeters (cm.) on a side, was heated on a hot block to 665° C. A gas mixture of about 0.16 mol % MBTC, 0.80 mol % TEOS, 0.75 mol % TEP, and the balance hot air at 160° C. was directed over the glass at a rate of 12.5 liters per minute (l/min) for about 10 seconds. The center of the glass surface was uniformly coated with a film which has a pale green color in reflected light. Using the Prism Coupler technique, the refractive index was found to be 1.60 and the thickness was about 4260 Å, corresponding to a deposition rate of about 426 Å/sec. Similarly deposited films have been shown to be amorphous by XRD, and to be composed of oxides of tin, silicon and phosphorus by XPS.

EXAMPLE 2

A gas mixture of about 1.84 mol % MBTC, 0.78 mol % TEOS, 0.75 mol % TEP, and the balance hot air was directed over a glass surface in the same manner as described in Example 1. The resulting film had a pale magenta color in reflected light. The refractive index was found to be 1.68, and the thickness was about 4930 Å, corresponding to a deposition rate of about 493 Å/sec. Similarly deposited films have been shown to be amorphous by XRD, and to be composed of oxides of tin, silicon and phosphorus by XPS.

EXAMPLE 3

A gas mixture of about 1.22 mol % MBTC, 0.58 mol % TEOS, 1.09 mol % $H_2O$ and the balance hot air was directed over a glass surface as described in Example 1, but for eight seconds. The resulting film has a green color in reflected light. The refractive index was found to be 1.78, and the film thickness was about 4650 Å, which corresponds to a deposition rate of about 580 Å/sec. From XRD analysis, similarly deposited films have been found to consist of collapsed tetragonal unit cells of tin oxide, indicating some solid-solution formation with silicon dioxide. XPS analysis shows that the films comprise oxides of tin and silicon.

EXAMPLE 4

Each of the films described in Examples 1 through 3 was successively deposited for one second in ascending-index order. The multi-layer film was then overcoated with about 3200 Å of fluorine-doped tin oxide. This film construction provided a transparent article with essentially no reflected color under conditions of daylight illumination.

EXAMPLE 5

A 9-cm. square of soda-lime silica glass was heated on a hot block to 665° C. A gas mixture of about 1.04 mol % MBTC in air at 160° C., and a gas mixture of 1.04 mol % TEOS and 0.20 mol % TEP in air at 160° C. were directed through two microprocessor-controlled globe valves over the glass at a total flow rate of 12.5 l/min for 30 sec. The globe valves were simultaneously opened and closed at a programmed rate such that the gas composition impinging on the glass sample was continuously changed from a mixture of high TEOS/-TEP and low MBTC to a mixture of low TEOS/TEP and high MBTC. The center of the glass surface was uniformly coated with a film consisting of oxides of tin, silicon and phosphorus as determined by XPS analysis. As the film thickness increased, the amount of tin gradually increased, while the amount of silicon and phosphorus decreased. The refractive index was calculated from these data, and from data derived from standard films, and found to lie between 1.52 and 1.87. This film construction provided an article with essentially no reflected color when overcoated with fluorine-doped tin oxide.

EXAMPLE 6

A gas mixture of about 0.16 mol % MBTC, 0.8 mol % TEOS, and the balance hot air was directed over a glass surface as described in Example 1 for about 60 seconds. The resulting film has a magenta color in reflected light, and a refractive index of 1.69. The film thickness was about 2260 Å, corresponding to a deposition rate of about 38 Å/sec.

EXAMPLE 7

A 0.5-l clear-glass beverage bottle was rotated and heated to about 600° C. in an oven over a three-minute period. The heated bottle was transferred into a coating chamber, where it was contacted with a vapor mixture of 0.16 mol % MBTC, 0.80 mol % TEOS, 0.75 mol % TEP, and the balance hot air at about 170° C. for 10 sec. The resulting film was magenta-blue in color, and was uniformly distributed on the sidewalls of the container from shoulder to base. The deposition rate was estimated to be about 200 Å/sec from the film color, compared to about 50 Å/sec for the bottle coated only with the vapor mixture of MBTC and TEOS.

From a review of the foregoing tables and examples, those skilled in the art will realize that TEB, TEP, and water serve as accelerants in the CVD of oxide films on glass, anti state TEP and TEB are synergistic in accelerating the deposition rate of TEOS and MBTC. Accelerants useful in this invention are chosen from the group consisting of borate and phosphite esters, alkyltin halides, and water.

While the composition of the present invention is preferably applied continuously to a moving glass substrate by methods known to those skilled in the art, the composition of this invention also has utility in batch processes. In application under conditions of continuous deposition, the composition is preferably maintained at temperatures below about 200° C., and more preferably below about 175° C., and applied to the glass moving at about 15 meters per second to provide deposition at a rate of at least 350 Å/sec., and preferably at a rate of at least 400 Å/sec.

Modifications and improvements to the preferred forms of the invention disclosed and described herein may occur to those skilled in the art who come to understand the principles and precepts hereof. Accordingly, the scope of the patent to be issued hereon should not be limited solely to the embodiments of the invention set forth herein, but rather should be limited only by the advance by which the invention has promoted the art.

What is claimed is:

1. A [gaseous composition] *process for forming an oxide composition comprising oxidizing a composition which is gaseous* at a temperature below about 200° C. at atmospheric pressure, *and which is* adapted to deposit at least a first layer of tin oxide and silicon oxide onto glass at a rate of deposition greater than about 350 Å/sec. wherein the composition comprises a precursor of tin oxide, a precursor of silicon oxide of formula $R_mO_nSi_p$, where m is from 3 to 8, n is from 1 to 4, p is from 1 to 4, and R is independently chosen from hydrogen and acyl, straight, cyclic, or branched-chain alkyl and substituted alkyl or alkenyl of from one to about six carbons, and phenyl or substituted phenyl, an accelerant selected from the group consisting of organic phosphites, organic borates and water, and mixtures thereof, and a source of oxygen.

2. The [gaseous composition] *process* of claim 1, adapted to deposit at least a first layer comprising tin oxide and silicon oxide onto transparent flat glass at a temperature of from 450° to about 650° C.

3. The [gaseous composition] *process* of claim 1, adapted to deposit at least a first layer comprising tin oxide and silicon oxide onto transparent flat glass to produce a glass article having essentially no reflected color in daylight.

4. The [gaseous composition] *process* of claim 1 adapted to continuously deposit at least a first layer of tin oxide and silicon oxide onto a continuously moving transparent flat glass substrate.

5. The [composition] *process* of claim 1 *where said composition is gaseous* at a temperature below about 175° C.

6. The [composition] *process* of claim 1 wherein the organic phosphite and *the* organic borate [accelerants] have the formula $(R''O)_3P$ and $(R''O)_3B$ where R" is independently chosen from straight, cyclic or branched-chain alkyl or alkenyl of from one to about six carbons; phenyl, substituted phenyl, or R''' $CH_2CH_2$—, where R''' is $MeO_2C$—, $EtO_2C$—, $CH_3CO$—, or HOOC—.

7. The [composition] *process* of claim 1 wherein the precursor of the tin oxide is $R_nSnX_{4-n}$, where R is a straight, cyclic, or branched-chain alkyl, or alkenyl of from one to about six carbons; phenyl, substituted phenyl, or $R'CH_2CH_2$—, where R' is $MeO_2C$—, $EtO_2C$—, $CH_3CO$—, or $HO_2C$—; X is selected from the group consisting of halogen, acetate, perfluoroacetate, and their mixtures; and where n is 0, 1, or 2.

8. The [composition] *process* of claim 1 wherein the precursor of the tin oxide is an alkyltin [chloride] *halide*.

9. The [composition] *process* of claim 1 wherein the precursor of the tin oxide is an alkyltin chloride.

10. The [composition] *process* of claim 1 wherein the precursor of the tin oxide is chosen from the group consisting of monobutylytin trichloride, dibutylytin dichloride, tributylytin chloride, and tin tetrachloride.

11. The [composition] *process* of claim 1 wherein the precursor of silicon oxide is selected from the group consisting of tetraethylorthosilicate, diacetoxydi-t-butoxysilane, ethyltriacetoxysilane, methyltriacetoxysilane, methyldiacetoxylsilane, tetramethyldisiloxane, tetraramethylcyclotetrasiloxane, dipinacoloxysilane, 1,1-dimethylsila-2-oxacyclohexane, tetrakis (1-methoxy-2-propoxy) silane, and triethoxysilane.

12. The [composition] *process* of claim 1 wherein the precursor of silicon oxide is tetraethylorthosilicate.

13. The [composition] *process* of claim 1 wherein the accelerant comprises triethyl phosphite.

14. The [composition] *process* of claim 1 wherein the accelerant comprises triethyl phosphite and triethyl borate.

15. The [gaseous composition] *process* of claim 1 adapted to deposit at least a first layer of tin oxide and silicon oxide onto glass at a rate of deposition greater than about 400 Å/sec.

16. The [gaseous composition] *process* of claim 1 adapted to deposit at least a first amorphous layer of tin oxide and silicon oxide onto glass.

17. The [gaseous composition] *process* of claim 1 adapted to deposit a plurality of layers comprising tin oxide and silicon oxide onto glass, the outermost layer of which is further adapted for deposited of at least a second layer.

18. The [composition] *process* of claim 17 adapted to deposit a plurality of layers comprising tin oxide and silicon oxide onto glass, the outermost layer of which is further adapted for deposit of a layer comprising tin oxide.

19. The [composition] *process* of claim 17 adapted to deposit a plurality of layers comprising tin oxide and silicon oxide onto glass the outermost layer of which is further adapted for deposit of a layer comprising tin oxide and fluorine.

20. The [composition] *process* of claim 17 wherein the second layer comprises a doped tin oxide.

21. The [composition] *process* of claim 17 wherein said plurality of layers are deposited from a precursor mixture comprising monobutyltin trichloride, tetraethyl orthosilicate and triethyl phosphite.

22. The [composition] *process* of claim 1 adapted to deposit at least a first layer comprising tin oxide and silicon oxide onto glass, said first layer having a refractive index which changes continuously between the glass substrate and the top of the layer.

23. A [gaseous composition] *process for forming an oxide composition comprising oxidizing a composition which is gaseous* at a temperature below about 200° C. at atmospheric pressure, adapted to deposit at least a first amphorous layer comprising tin oxide and silicon oxide onto glass at a rate of deposition greater than about 400 Å/sec., the layer having a controlled index of refraction, wherein the composition comprises a tin oxide precursor, a silicon oxide precursor of formula $R_mO_nSi_p$, where m is from 3 to 8, n is from 1 to 4, p is from 1 to 4, and R is independently chosen from hydrogen and acyl, straight, cyclic, or branched-chain alkyl and substituted alkyl or alkenyl of from one to about six carbons, and phenyl or substituted phenyl, and at least one accelerant chosen from the group consisting of boron and phosphorous esters and water.

24. The [gaseous composition] *process* of claim 23 adapted to continuously deposit at least a first layer comprising tin oxide and silicon oxide onto a continuously moving flat glass substrate at a temperature of from about 450° to about 650° C., and comprising monobutyltin trichloride, tetraethyl orthosilicate and an accelerant.

25. A [gaseous composition] *process for forming an oxide composition comprising oxidizing a composition which is gaseous* at a temperature below about 200° C. and at atmospheric pressure, *and which is* adapted to deposit at least a first layer comprising amorphous tin oxide and silicon oxide onto glass at a temperature of front about 450° to 650° C. at a rate of deposition greater than about 350 Å/sec., wherein the composition comprises:

a tin oxide precursor of formula $R_nSnX_{4-n}$, where R is a straight, cyclic, or branched-chain alkyl, or alkenyl of from one to about six carbons; phenyl, substituted phenyl, or $R'CH_2CH_2$—, where R' is $MeO_2C$—, $EtO_2C$—, $CH_3CO$—, or $HO_2C$—; X is selected from the group consisting of halogen, acetate;, perfluoroacetate, and their mixtures; and where n is 0, 1, or2;

a silicon oxide precursor of formula $R_mO_nSi$, where m is from 3 to 8, n is from 1 to 4, p is from 1 to 4, and R is independently chosen from hydrogen and acyl, straight, cyclic, or branched-chain alkyl and substituted alkyl or alkenyl of from one to about six carbons, and phenyl or substituted phenyl;

one or more accelerants selected from the group consisting of water and organic phosphites and organic borates of formula $(R''O)_3P$ and $(R''O)_3B$ where R'' is independently chosen from straight, cyclic or branched-chain alkyl or alkenyl of from one to about six carbons; phenyl, substituted pheny, or R''' $CH_2CH_2$—, where R''' is $MeO_2C$—, $EtO_2C$—, $CH_3CO$—, or HOOC—; and a source of oxygen.

26. A [composition] *process* according to claim 25 in which the precursor of the tin oxide is an alkyltin halide, the precursor of the silicon oxide is tetraethylorthosilicate, diacetoxydi-t-butoxysilane, ethyltriacetoxysilane, methyltriacetoxysilane, methyldiacetoxylsilane, tetramethyldisiloxane, tetramethylcyclotetrasiloxane, dipinacoloxysilane, 1,1-dimethylsila-2-oxacyclohexane, tetrakis (1-methoxy-2-propoxy) silane, or triethoxysilane, and the accelerant comprises one or both of triethyl phosphite and triethyl borate.

27. A [composition] *process* according to claim 26 in which the tin oxide precursor comprises monobutyltin trichloride, the silicone oxide precursor comprises tetraethyl orthosilicate and the accelerant comprises triethyl phosphite.

* * * * *